United States Patent [19]

Nijman

[11] 4,126,370

[45] Nov. 21, 1978

[54] FILTER CONNECTOR WITH RADIAL MOUNTING MEANS

[75] Inventor: John P. Nijman, Scarborough, Canada

[73] Assignee: Bunker Ramo Corporation, Oak Brook, Ill.

[21] Appl. No.: 807,382

[22] Filed: Jun. 17, 1977

[51] Int. Cl.$^2$ ......................... H01R 13/34; H03H 7/04

[52] U.S. Cl. .................................... 339/143 R; 333/79

[58] Field of Search .................... 333/79; 339/143 RC, 339/217 RS; 317/257

[56] References Cited

U.S. PATENT DOCUMENTS

| | | | |
|---|---|---|---|
| 3,710,285 | 1/1973 | Schor et a. | 333/79 |
| 3,825,874 | 7/1974 | Peverill | 339/147 R X |
| 3,938,874 | 2/1976 | Bourdon | 339/217 S X |

FOREIGN PATENT DOCUMENTS

| | | | |
|---|---|---|---|
| 2,279,236 | 2/1976 | France | 339/147 R |

*Primary Examiner*—Roy Lake
*Assistant Examiner*—E. F. Desmond
*Attorney, Agent, or Firm*—William Lohff; F. M. Arbuckle

[57] ABSTRACT

An electrical connector assembly including a tubular electrical interference filter mounted coaxially about an electrical conductor in a dielectric insert having means for flexibly engaging and mounting the filter in the dielectric insert. In particular, the dielectric insert includes a plurality of longitudinally extending ribs protruding into the passageway of the dielectric insert to flexibly engage and support the tubular filter therein and thereby isolate the filter from radial stress commonly occurring during the telescopic engagement of the electrical connector assembly by a complementary connector assembly.

4 Claims, 7 Drawing Figures

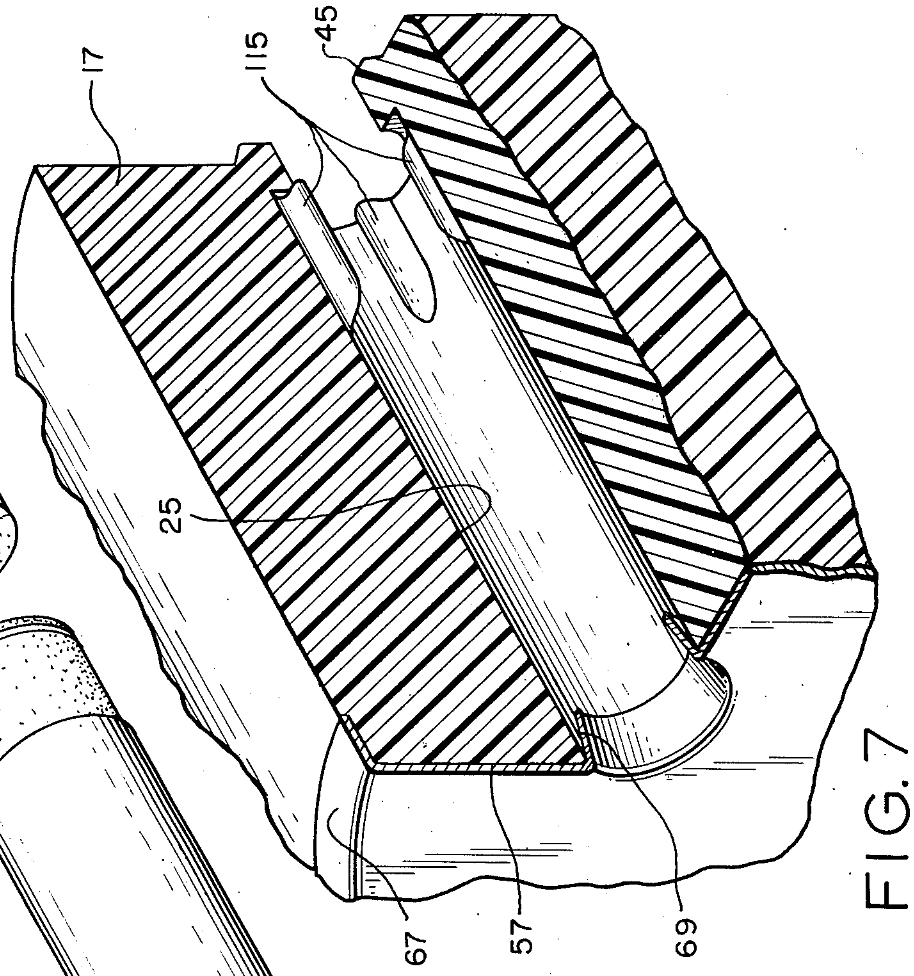
FIG. 7
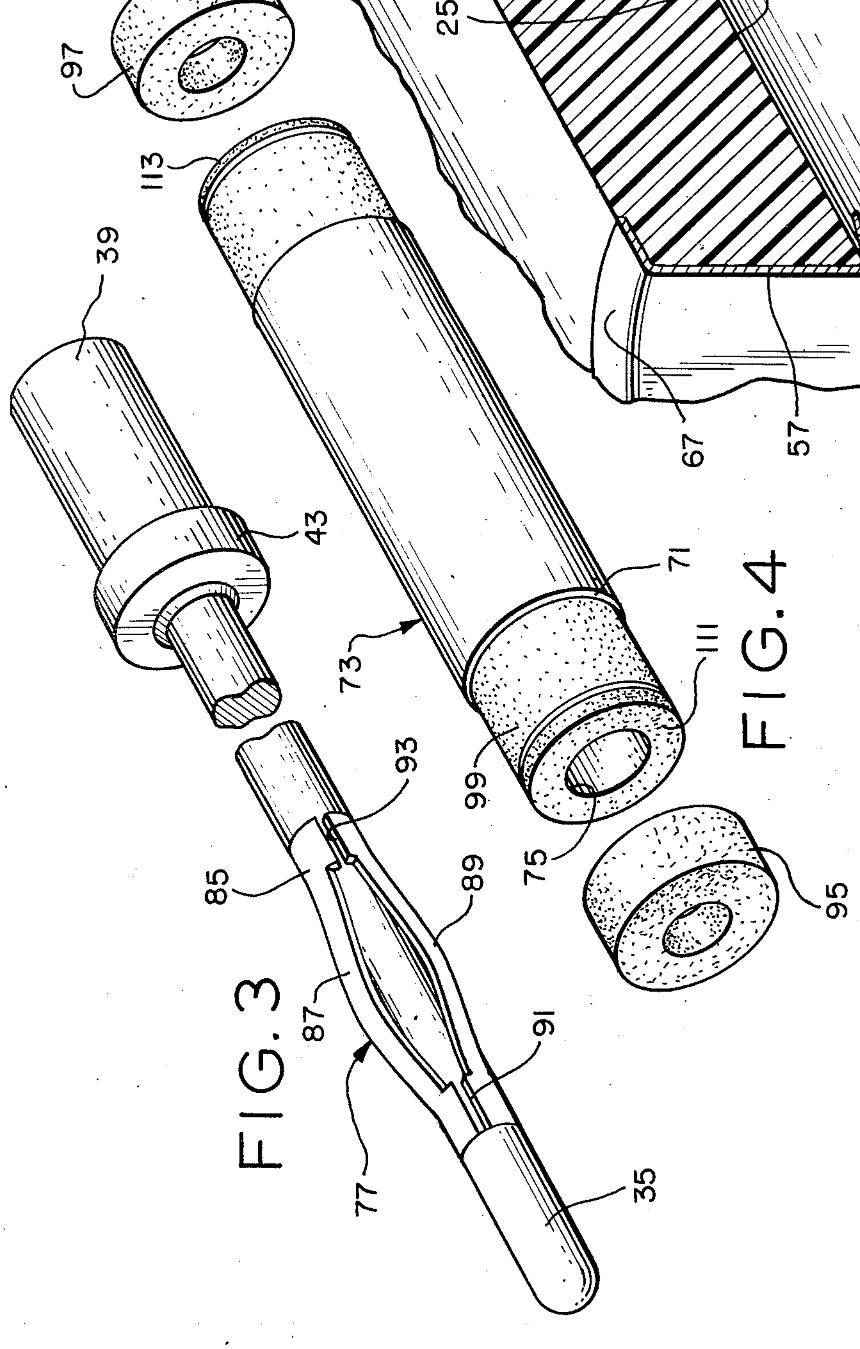
FIG. 4
FIG. 3

FILTER CONNECTOR WITH RADIAL MOUNTING MEANS

BACKGROUND OF THE INVENTION

This invention relates generally to electrical connector assemblies incorporating electrical interference filters and more particularly to an electrical connector assembly wherein an electrical interference filter is shock mounted to isolate the filter from radially directed stress.

Electrical connector assemblies incorporating tubular electrical interference filters are commonly utilized to prevent electrical noise or interference from passing from one electrical circuit to another through the connector coupling the two circuits, the filter passing only signals at a desired frequency. In such connector assemblies the tubular filter is commonly mounted in a passageway through the dielectric insert in the metal connector shell of the connector assembly. The electrical conductor, or contact pin, in turn, is mounted in and extends through the longitudinal opening through the tubular filter. In male connectors, the contact pin extends through the front seal of the connector assembly to engage the corresponding complementary receptacle contact of a female connector assembly while the complementary receptacle of the female connector is coupled to the conductor extending through the filter and extends to an aperture in the front seal to receive the male contact pin.

Tubular electrical interference filters, however, which commonly include an inductive ferrite tube coaxially mounted inside a ceramic tubular element, are extremely fragile and susceptible to breakage when sufficient radial force is applied thereto. Misalignment between the filter and the dielectric insert during telescopic engagement of one connector assembly with another connector may cause the contact to be displaced radially to exert pressure on the inner surface of the filter. This may result in significant radial stress on the ceramic element and the ferrite tube sufficient to damage the filter.

SUMMARY OF THE INVENTION

Accordingly, it is the primary object of the invention to provide apparatus for mounting the tubular electrical interference filter in the dielectric insert of an electrical connector assembly so that the filter is isolated from the radial stresses commonly associated with and resulting from the mating of the electrical connector assembly with a complementary connector.

Another object of the invention is to provide a radial stress isolating filter mounting apparatus which centers the tubular filter in the electrical connector assembly to prevent damage to the filter when the electrical conductor or contact is inserted into the connector and the filter.

Another object of the invention is to provide a radial stress isolating filter mounting apparatus facilitating the rotational insertion of the tubular filter therein.

In accordance with the present invention, there is provided an electrical connector assembly comprising a metal connector shell and a dielectric insert means mounted therein having a passageway in which the tubular electrical interference filter is mounted. Means are provided for mounting an electrical conductor in the tubular filter and includes means for electrically coupling the filter to the electrical conductor. Means are also provided for electrically coupling the filter to the metal connector shell. The dielectric insert means includes means for flexibly mounting the tubular electrical interference filter in the passageway of the dielectric insert to isolate the flter from radial stresses which might otherwise be transmitted thereto. In particular, the flexible mounting means comprises a plurality of members protruding from the dielectric insert in a substantially radial direction to flexibly engage and mount the tubular filter in the passageway. In one embodiment of the present invention, the protruding members comprise at least three longitudinal ribs extending into the passageway at the rear thereof which are angled slightly to deviate from the radial direction.

BRIEF DESCRIPTION OF THE DRAWINGS

Other objects, features and advantages of the invention, its organization, construction and operation will be best understood from the following detailed description taken in conjunction with the accompanying drawing, on which:

FIG. 3 is a perspective view of the contact pin of the connector assembly showing the spring contact element employed to mount the tubular filter on the contact pin;

FIG. 4 is an exploded perspective view illustrating the tubular filter and associated stress isolating members which are mounted on the contact pin assembly shown in FIG. 4;

FIG. 7 is a fragmentary prospective view, shown partially in section, of the dielectric insert and the apparatus provided for flexibly mounting the tubular filter in the passageway of the dielectric insert to isolate the filter from radial stress.

DESCRIPTION OF THE PREFERRED EMBODIMENTS

Figure 1:
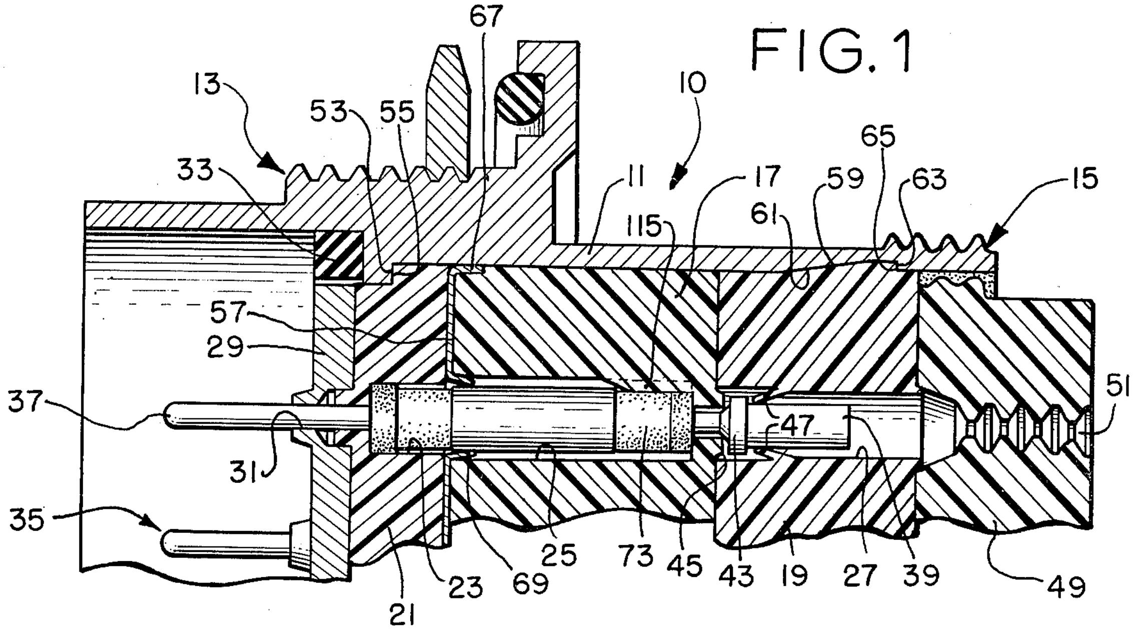
FIG. 1 is a fragmentary sectional view of an electrical connector assembly constructed in accordance with the present invention.
Figure 2:
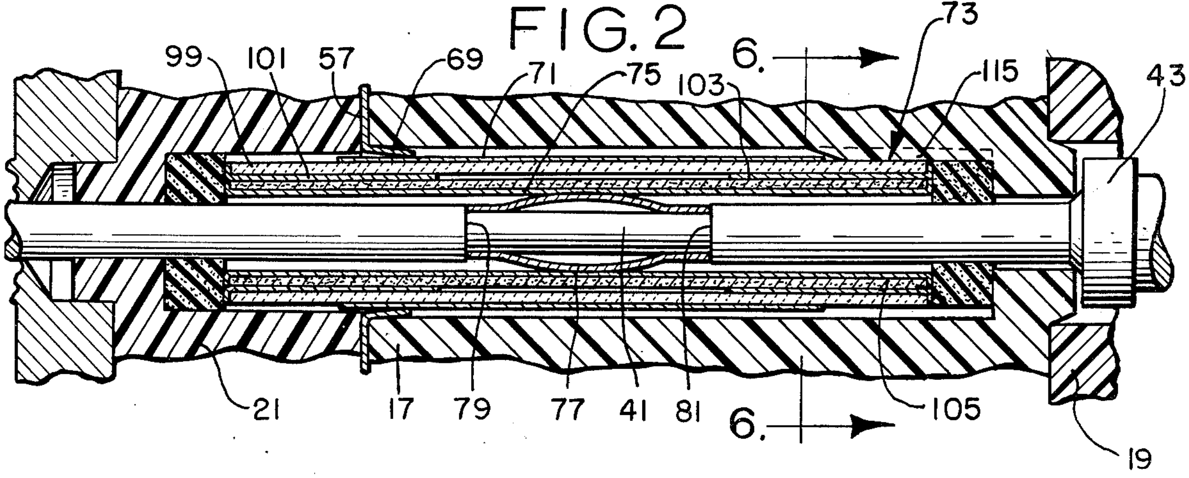
FIG. 2 is an enlarged view of the fragmentary sectional view of FIG. 1 illustrating in greater detail apparatus for flexibly mounting the tubular electrical interference filter in the passageway of the dielectric insert.

Referring to FIGS. 1 and 2, an electrical connector assembly is generally illustrated at 10 as comprising a metal connector shell or housing 11 having a threaded front end, identified generally at 13, for telescopic engagement with a mating connector assembly (not shown) and a rear end, identified generally at 15, for attachment to a multi-conductor cable. A dielectric contact supporting structure is mounted in the housing 11 and comprises a dielectric insert 17, a contact retention disc 19 and a dielectric insert 21. The dielectric inserts and the contact retention disc are preferably constructed of a high-temperature resisting dielectric material. The dielectric insert 21 has a passageway 23 therethrough which is aligned with a passageway 25 in the dielectric insert 17 and with a passageway 27 in the contact retention disc 19. A front seal 29 having a passageway 31 which is aligned with the passageways 23, 25 and 27 and a peripheral rim seal 33 is positioned in the housing 11 forward of the dielectric insert 21.

A plurality of electrical contacts 35 are mounted in the electrical connector assembly. More specifically, and as illustrated in detail in FIG. 1, an elongated pin contact 35 mounted in the aligned passageways 23, 25, 27, 31 includes a forward portion 37 for mating engagement with the complementary contact of a mating connector assembly, a tail portion 39 for connection to an electrical conductor, and an intermediate portion 41 therebetween mounted generally within the dielectric inserts 17 and 21.

It is also to be understood that the term "pin" is used herein in a broad sense to denote any type of contact which extends through and is electrically connected to a tubular filter, and should not be taken to mean only a male contact.

The contact 35 includes a radially extending flange 43 having a forward surface for engaging a rear surface portion 45 of the dielectric insert 17 to prevent forward movement of the contact and a rear surface which engages flexible tines 47 to prevent rearward movement of the contacts. Of course, outward deflection of the tines 47 with a suitable tool will permit release and removal of the contact 35. Such structure is generally known in the art as a rear release structure. Rearwardly of the contact retention disc 19 is a rear seal 49 having a conductor passageway 51 therethrough for receiving the conductor which is to be attached to the tail portion 39 of the contact 35. As is well known in the art, compression of the rear seal 49 causes a radial sealing expansion thereof against the inner surface of the metal shell 11 and sealing at the passageway 51 to the individual conductors. The front seal 29, the rim seal 33 and the rear seal 49 are formed of a rubber compound, preferably a fluid resisting fluorosilicone rubber.

Each of the inserts and the retention discs is essentially disc or cylindrically shaped. Forward movement of the insert 21 is prevented by engagement of a forward facing shoulder 53 thereof against a rearward facing shoulder 55 of the metal shell 11. The insert 17 bears against the insert 21, via a ground plate 57 which will be discussed below, and the retention disc 19 bears directly against the insert 17. It will be noted that the retention disc 19 includes a gently, outwardly extending ramp portion 59 which snaps into a correspondingly shaped recess portion 61 of the metal shell 11 so that a rearwardly facing shoulder 63 thereof engages a forwardly facing shoulder 65 of the metal shell 11 to retain the retention disc 19 and the inserts 17 and 21 within the metal shell 11.

The metal ground plane conductor 57 comprises a perforate disc mounted between the dielectric insert 17 and the dielectric insert 21. The ground plane conductor 57 includes a peripheral spring flange 67 which engages the inner surface of the metal connector shell 11. At the location of each contact, the conductor 67 includes an aperture defined by an annular spring flange 69 which extends rearwardly and radially inwardly with respect to the longitudinal axis of the contact to engage the ground terminal 71 which is carried on the outer surface of a tubular electrical interference filter 73. The tubular filter 73 also includes an inner conductor 75 which is electrically connected to the elongate pin contact 35 at the intermediate portion 41 by means of a spring element 77. The intermediate portion 41 includes a reduced diameter portion having a rearward facing surface 79 and a forward facing surface 81. The spring element 77 is mounted between and bears against these surfaces.

As further illustrated in FIG. 3, the spring element 77 comprises a generally annular portion 83 and a generally annular portion 85 interconnected by a pair of outwardly bowed portions 87 and 89. The annular portion 83 includes a longitudinal slit 91 and the annular portion 85 includes a longitudinal slit 93 to permit snapping of the spring element over the reduced diameter portion of the pin contact 35. The bowed portions 87 and 89 of the spring element engage the inner conductor 75 of the tubular filter 73 to make electrical contact therewith and support the tubular filter 73 on the pin contact 35 within the aligned passageways 23 and 25. As further illustrated in FIG. 4, elastomeric membranes 95 and 97 may be disposed in front of and behind the filter 73 to isolate the filter from certain longitudinally directed forces resulting from impact to the forward portion 37 of the pin contact 35 or vibration in the well-known manner.

Figure 5:
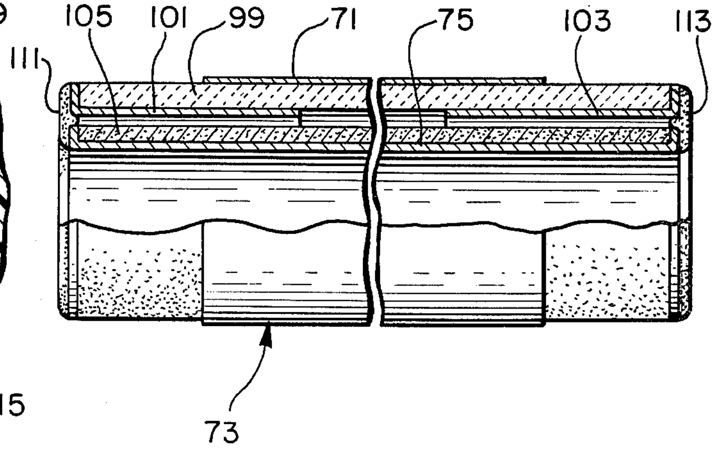
FIG. 5 is an elevational view, shown partially in section, of the tubular filter illustrated in FIG. 1.

Referring to FIG. 5, the filter 73 is illustrated in greater detail and may comprise, for example, a hollow, tubular ceramic tube 99 having an inner surface and an outer surface. A metal layer 71 is carried on the outer surface and, in one embodiment, may carry a pair of metal layers 101 and 103 spaced apart on the inner surface in an overlapping relationship with respect to the metal layer 71. The metal layers 101 and 103 constitute capacitor plates or electrodes and the metal layer 71 constitutes a capacitor plate or electrode which is common to the plates 101 and 103. The metal layer 84 therefore constitutes, when connected as shown in FIGS. 1 and 2, a ground terminal for the capacitors. Mounted coaxially within the tubular capacitor is a tubular inductor which comprises a ferrite tube 105 which also has an outer surface and an inner surface. The inner surface of the ferrite tube 105 carries a metal layer 75 which is connected at each end of the tube to the metal layers 101 and 103. The metal layers 75, 101 and 103 are connected by metal conductors 111 and 113.

Figure 6:
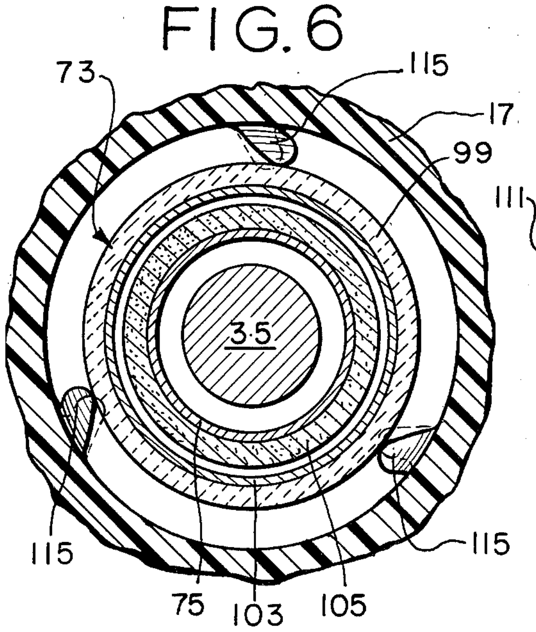
FIG. 6 is a fragmentary sectional view taken along lines 6—6 in FIG. 2.

With reference now also to FIGS. 6 and 7, it will be seen that in accordance with the present invention the dielectric insert 17 includes a plurality, preferably at least three, longitudinally extending tines or ribs 115 which extend into the passageway 25 at the rear end thereof. The ribs 115 protrude in a generally radial direction into the passageway 25 to engage and support the tubular filter 73 in the passageway 25. In particular, the ribs 115 combine with the metal ground plane conductor 57 to center the filter 73 in the passageway 25. The radial dimension of each of the ribs 115 is sufficiently long so that the tubular filter 73, when inserted in the passageway 25, forces the ribs 115 outwardly from the center of the passageway 25 towards the inner surface of the dielectric insert passageway 25. The ends of the ribs 115 are rounded to minimize the surface contact between the ribs 115 and the tubular filter 73. As will be seen most clearly in FIG. 6, the ribs 115 are not disposed in the truly radial direction, but are instead angled slightly in the same direction so that the ribs 115 are flexible in the radial direction and to facilitate rotational insertion of the tubular filter 73 into the passageway 25 during assembly of the electrical connector assembly. Moreover, the thickness of the ribs 115 is such that the ribs are sufficiently flexible to be bent outward readily when the tubular filter 73 is inserted, but also sufficiently stiff to stably support the filters 73 therein. Accordingly, the ribs 115 isolate the tubular filter 73 from any radially directed stress resulting from misalignment of the pin contact 35 and the complementary receptacle of another connector when the connector assembly telescopically engages the other connector and absorb any radial stress which might otherwise damage the filter.

Although in the present embodiment three longitudinal ribs are provided to shock mount the tubular filter 73 in the passageway 25 of the dielectric 17, it will be readily understood that additional ribs may be utilized provided that sufficient flexibility is maintained. Moreover, although in the present embodiment the longitudinal ribs 115 are shown as being integral to the dielectric insert 17, the shock mounting ribs may be constructed as a separate element to be inserted in the passageway 25 to shock mount and cushion the tubular filter 73 therein.

Although I have described my invention by reference to a particular illustrative embodiment thereof, many changes and modifications of the invention may become apparent to those skilled in the art, without departing from the spirit and scope of the invention. I, therefore, intend to include within the patent warranted hereon all such changes and modifications as may reasonably and properly be included within the scope of my contribution to the art.

I claim:

1. An electrical connector assembly, including a metal connector shell, comprising:

an electrical conductor;

a tubular electrical interference filter;

means for mounting said electrical conductor in said tubular electrical interference filter to extend therethrough including means for electrically connecting said tubular interference filter to said electrical conductor;

means for electrically coupling said tubular electrical interference filter to said metal connector shell:

dielectric insert means mounted in said shell and including a passageway therethrough having a generally cylindrical sidewall; and means for flexibly engaging and mounting said tubular electrical interference filter within said passageway and spaced from said sidewall of said passageway, said engaging and mounting means including a plurality of flexible longitudinal ribs and a spring flange associated with said electrical coupling means, said ribs extending from said insert into said passageway and offset from the radial direction to cooperate with one end of said filter and said spring flange extending into said passageway to cooperate with said filter at a point remote from said one end, said ribs and said spring flange together isolating said filter from shock.

2. The electrical connector assembly of claim 1, wherein said means for electrically coupling said tubular electrical interference filter comprises a perforate conductive disc having an aperture defined by said spring flange through which said tubular electrical interference filter extends.

3. The electrical connector assembly of claim 1, wherein said plurality of longitudinal ribs comprises at least three ribs spaced substantially equidistant around said passageway.

4. The electrical connector assembly of claim 3, wherein each of said longitudinal ribs has a rounded end for engagement with said filter.

* * * * *